United States Patent [19]
Arntz

[11] Patent Number: 5,751,250
[45] Date of Patent: May 12, 1998

[54] LOW DISTORTION POWER SHARING AMPLIFIER NETWORK

[75] Inventor: Bernard James Arntz, Morristown, N.J.

[73] Assignee: Lucent Technologies, Inc., Murray Hill, N.J.

[21] Appl. No.: 542,480

[22] Filed: Oct. 13, 1995

[51] Int. Cl.[6] .............................. H01Q 3/22; H01Q 3/24; H01Q 3/26
[52] U.S. Cl. .............................. 342/373; 330/124 R
[58] Field of Search .............................. 342/373, 374; 330/124 R, 124 D, 149

[56] References Cited

U.S. PATENT DOCUMENTS

| | | |
|---|---|---|
| 3,480,885 | 11/1969 | Schrank . |
| 3,731,217 | 5/1973 | Gerst et al. . |
| 3,917,998 | 11/1975 | Welti . |
| 4,316,192 | 2/1982 | Acoraci . |
| 4,907,004 | 3/1990 | Zacharatos et al. . |
| 4,926,136 | 5/1990 | Olver . |
| 4,965,587 | 10/1990 | Lenormand et al. . |
| 5,093,668 | 3/1992 | Sreenivas . |
| 5,105,170 | 4/1992 | Joshi . |
| 5,115,248 | 5/1992 | Roederer . |
| 5,119,042 | 6/1992 | Crampton et al. . |
| 5,134,417 | 7/1992 | Thompson . |
| 5,325,101 | 6/1994 | Rudish et al. . |
| 5,414,433 | 5/1995 | Chang . |
| 5,574,967 | 11/1996 | Dent et al. .............................. 455/12.1 |

FOREIGN PATENT DOCUMENTS

| | | |
|---|---|---|
| 0355979A2 | 2/1990 | European Pat. Off. . |
| 0473299A2 | 3/1992 | European Pat. Off. . |
| 0552059A1 | 7/1993 | European Pat. Off. . |

OTHER PUBLICATIONS

European Search Report, EP 96 30 7331, Jan. 28, 1996.
W. A. Sandrin, "The Butler Matrix Transponder", Comsat Technical Review, vol. 4, No. 2, Fall 1974.

*Primary Examiner*—Theodore M. Blum

[57] ABSTRACT

In a preferred embodiment, a low distortion power sharing amplifier network capable of amplifying a plurality of input signals includes a plurality of amplifiers, each for amplifying an approximately equal amount of RF signal power. The power sharing arrangement prevents any one of the amplifiers in the network from operating too deep into saturation even when the plurality of input signals vary widely in power. Distortion is reduced by coupling at least one feedforward loop to the amplifier network.

19 Claims, 7 Drawing Sheets

LOW DISTORTION POWER SHARING AMPLIFIER NETWORK

BACKGROUND

1. Field of the Invention

The present invention relates generally to amplifier networks, and more particularly, to a low distortion power shared amplifier network, which is particularly useful in wireless communications.

2. Description of the Related Art

Wireless telecommunications systems of the prior art typically employ a separate high power radio frequency (RF) amplifier to excite each transmitting antenna used at the base station. Typically, each power amplifier amplifies the modulated RF signals of a plurality of frequency channels for transmission to mobile users and/or to stationary sites. Multi-sector systems employ a plurality of directional antennas to provide directional beams over predefined azimuthal sectors, thereby attaining 360 degree coverage with improved range. Each power amplifier associated with a given antenna is thus dedicated to amplifying only those signals to be transmitted within the associated azimuthal sector.

FIG. 1 depicts a schematic block diagram of a prior art base station transmitter configuration for a three sector system. Antennas $AT_1$–$AT_3$ each transceive within a given 120° azimuthal sector to achieve 360 degree coverage within a given radius of the base station. Power amplifiers $P_1$–$P_3$ each amplify a respective multiplexed signal $S_{MUX1}$–$S_{MUX3}$, which are typically frequency division multiplexed (FDM) signals. N-channel combiners $CN_1$–$CN_3$ each combine up to N input signals to provide the multiplexed signals. Power amplifiers $P_1$–$P_3$ are generally sized so as to handle a peak traffic load that is based on statistics or on the maximum number of radios in its associated sector, since traffic load fluctuates minute by minute.

Whenever an amplifier that is not perfectly linear amplifies a multi-carrier signal, undesirable intermodulation distortion (IMD) products are produced, resulting in distortion of the output signal and interference between channels. As amplifier input power increases, so do the IMD products. Thus, when the base station transmitter is transmitting to a large number of subscribers within a single azimuthal sector, the power amplifier $P_1$–$P_3$ associated with that sector can become saturated, and the IMD products may be higher. Meanwhile, the other power amplifiers, which service other azimuthal sectors, may be under-utilized. Thus, RF power is not utilized efficiently, which limits the number of subscribers that can use the system on a statistical basis.

SUMMARY OF THE INVENTION

Embodiments of the present invention can reduce distortion of signals by employing a low distortion amplifier network in which the amplifiers of the network share power between them. This allows power from an under-utilized amplifier to be directed to an amplifier with a high signal load.

A preferred embodiment of the present invention is directed towards a low distortion power sharing amplifier network that is capable of amplifying a plurality of RF input signals that may have different carrier frequencies and/or power levels. Each amplifier in the network amplifies substantially the same amount of signal power so that no single amplifier is driven further into saturation than are the others. The amplifier network preferably includes a first distributing network for splitting each of the RF input signals among a plurality of first output ports, such that a composite signal is present at each of the first output ports. Each composite signal contains signal power of all of the input signals. A plurality of RF amplifiers amplify the composite signals in a power sharing arrangement to provide a set of amplified composite signals. A second distributing network reconstructs the amplified composite signals to provide a set of RF output signals, each indicative of an associated one of the input signals.

Distortion within the RF output signals, which results from nonlinear amplification within the amplifiers, is reduced by advantageously employing a feed-forward loop associated with each output signal. This enables more efficient amplifiers to be used in the power sharing arrangement to achieve a given distortion level in each output signal.

BRIEF DESCRIPTION OF THE DRAWINGS

For a full understanding of the present invention, reference is had to exemplary embodiments thereof, considering in conjunction with the accompanying drawings in which like reference numerals depict like elements or features, for which.

DETAILED DESCRIPTION OF THE PREFERRED EMBODIMENTS

Figure 2:
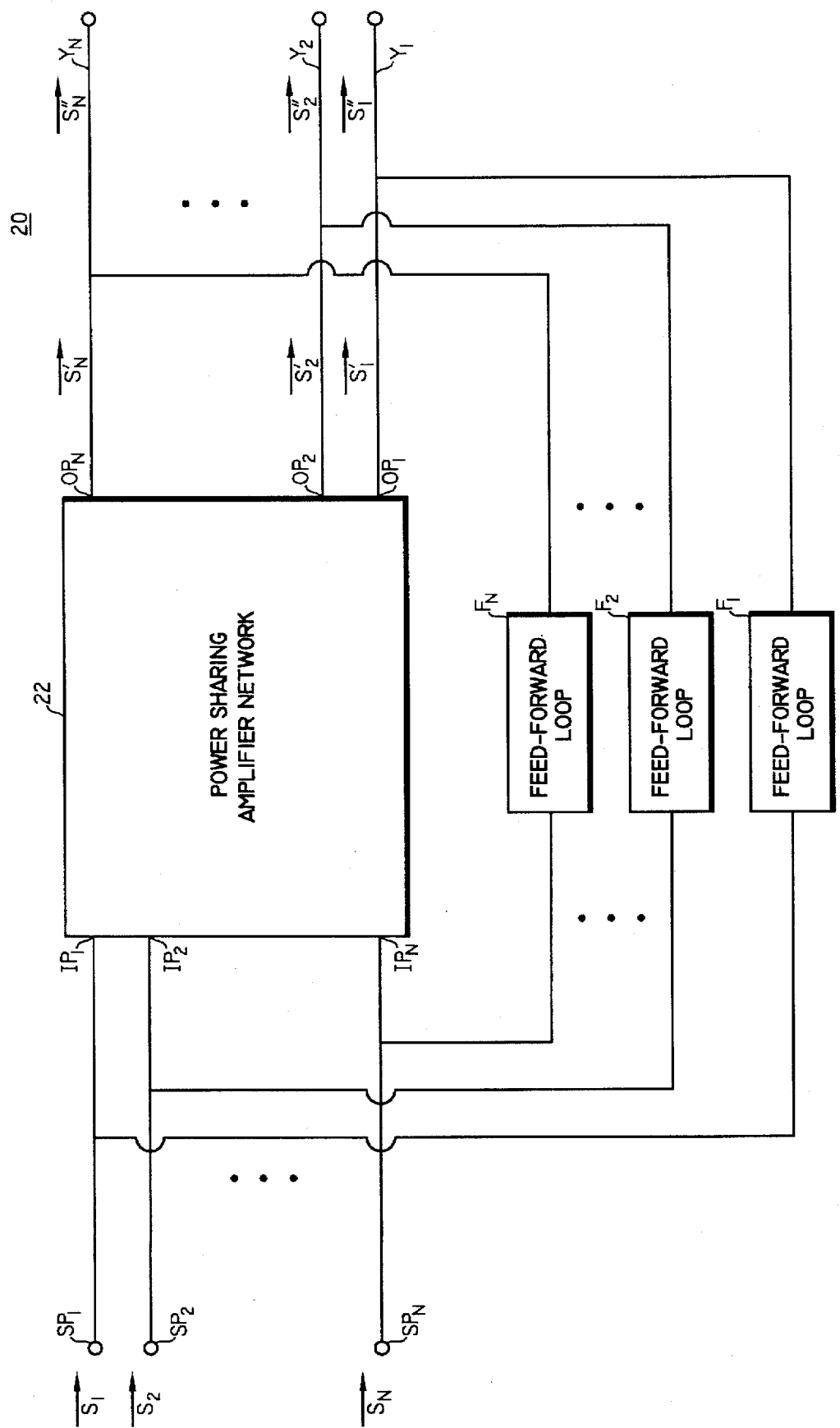
FIG. 2 is a schematic block diagram of an embodiment of a low distortion power sharing amplifier network in accordance with the present invention.

FIG. 2 shows a schematic block diagram of a low distortion power sharing amplifier network, designated generally as 20. Amplifier network 20 is operative to linearly amplify a plurality N of input signals $S_1$–$S_N$ applied to respective input ports $SP_1$–$SP_N$. Each input signal $S_1$–$S_N$ may be an RF modulated, multicarrier signal, such as an FDM signal. N corresponding amplified output signals $S_1''$–$S_N''$ are produced at respective output ports $Y_1$–$Y_N$.

Amplifier network 20 includes power sharing amplifier network 22, which functions to amplify input signals $S_1$–$S_N$ that appear at respective input ports $IP_1$–$IP_N$, to thereby produce output signals $S_1'$–$S_N'$ at respective output ports $OP_1$–$OP_N$. Amplifier network 22 employs a plurality of amplifiers (not shown in FIG. 2) configured in a power sharing arrangement, such that each amplifier amplifies a substantially equal amount of signal power from all of signals $S_1$–$S_N$. Detailed configurations for network 22 will be discussed below.

Distortion products present within signals $S_1'$–$S_N'$ are diminished by employing feed-forward loops $F_1$–$F_N$, each associated with one of signals $S_1'$–$S_N'$. Consequently, output signals $S_1''$–$S_N''$ exhibit less distortion than signals $S_1'$–$S_N'$. Preferably, the number of feed-forward loops $F_1$–$F_N$ correspond to the number of signals $S_1'$–$S_N'$. It is understood that less than N feed-forward loops may be employed if it is desired to reduce distortion in only selected ones of the output signals.

It is noted that in some applications, one or more of input ports $SP_1$–$SP_N$ will be unused, and no input signal will be applied to the unused port or ports. In this case, there will be no signal on the corresponding output port $Y_1$–$Y_N$.

Figure 3:
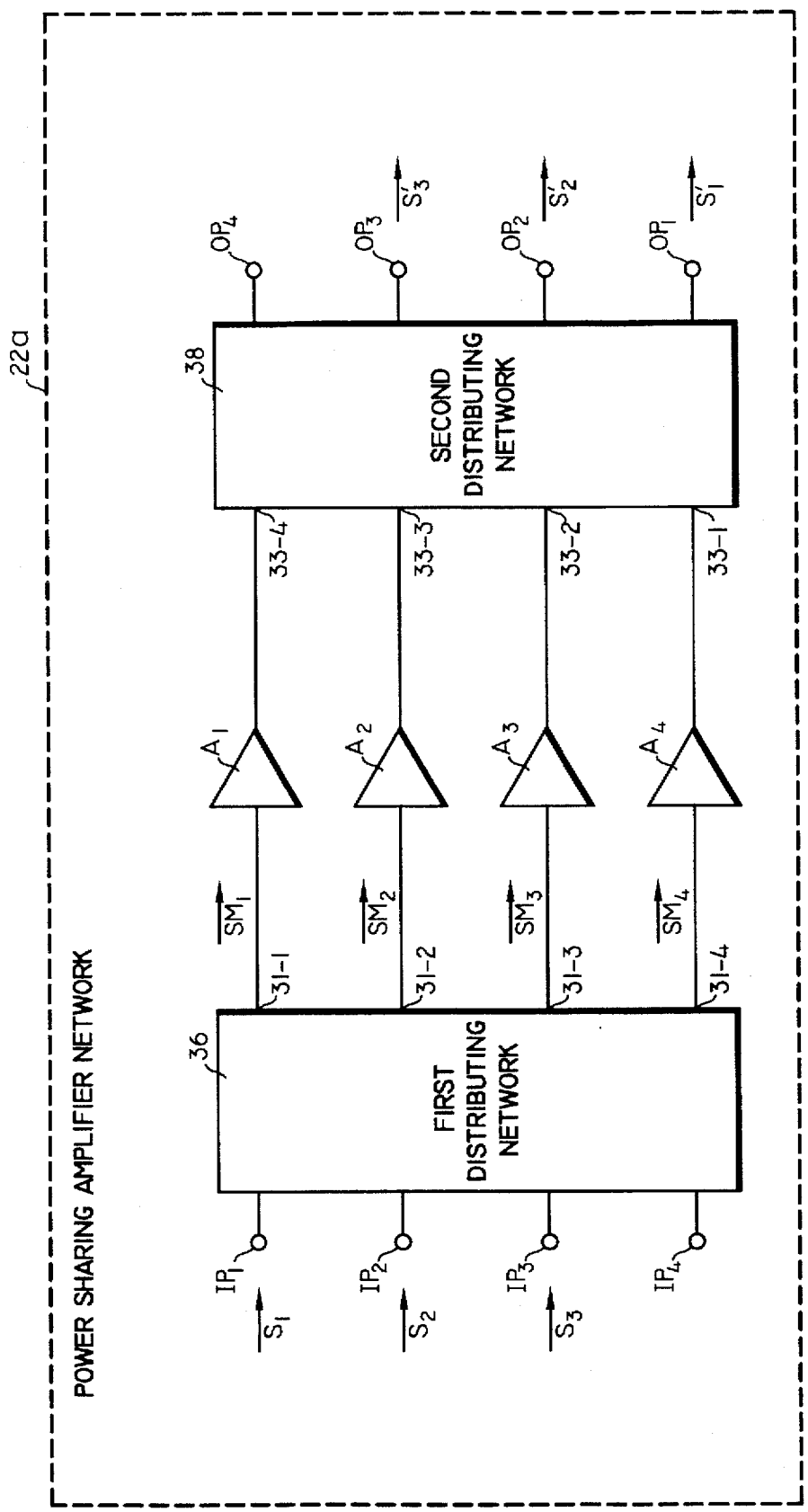
FIG. 3 shows a schematic block diagram of a power sharing amplifier network, which may be used within the network of FIG. 2.

FIG. 3 shows a schematic block diagram of an exemplary power sharing amplifier network 22a, which is an embodiment of amplifier network 22 of FIG. 2. For illustrative purposes, amplifier network 22a will be described as one which amplifies each of three input signals $S_1$–$S_3$. It is understood, however, that more or fewer input signals can be amplified by analogous embodiments of network 22a, as will be explained below.

First distributing network 36 receives input signals $S_1$–$S_3$ at respective first input ports $IP_1$–$IP_3$. In this example, no signal is applied to unused input port $IP_4$. First distributing network 36 divides signal power from each signal $S_1$–$S_N$ among first output ports 31-1 to 31-4, to produce respective composite signals $SM_1$–$SM_4$ thereon. Each composite signal $SM_1$–$SM_4$ is thus comprised of signal power of all input signals $S_1$, $S_2$ and $S_3$. Preferably, each input signal $S_1$–$S_3$ is divided equally among output ports 31-1 to 31-4. This way, composite signals $SM_1$–$SM_4$ have substantially equal average power, even if signals $S_1$–$S_3$ vary widely in power. Thus, in the present example, each composite signal $SM_1$–$SM_4$ will contain approximately ¼ of the signal power of each input signal $S_1$–$S_3$.

Composite signals $SM_1$–$SM_4$ are applied to respective power amplifiers $A_1$–$A_4$, which preferably have substantially identical performance specifications, such as gain, insertion phase, output power, gain versus frequency and temperature, operating bias voltages, and so on. Amplifiers $A_1$–$A_4$ are, in practice, not perfectly linear, and will typically produce a finite amount of IMD products when signals $SM_1$–$SM_4$ contain multiple carriers. For randomly changing input phase conditions, composite signals $SM_1$–$SM_4$ are substantially equal in power when averaged over many envelope cycles. Thus, amplifiers $A_1$–$A_4$ each typically provide the same amount of output power as the others at any given time. Thus, even if input signals $S_1$–$S_3$ vary in power, no single amplifier will be driven further into saturation than the others.

For example, in a wireless communication system, input signals $S_1$–$S_3$ may be multi-carrier signals, each carrying communication signals intended for wireless terminals within a given angular sector. In this case, when communication traffic is distributed unequally among the angular sectors, amplifiers $A_1$–$A_4$ will nevertheless amplify substantially the same amount of signal power. This aspect of the invention provides a marked advantage as compared to the prior art systems discussed above. A corresponding decrease in hardware needed at each base station may be realized as a natural consequence of such a power-sharing arrangement while keeping the same blocking rate. A major benefit of such power sharing is that power may be shared to realize a reduction in the total power requirements at the base station. For instance, power may be diverted to one sector when the input is driven by a large number of radios. This power may be added to the sector by means of switching in more radios. Alternatively, the power of a given radio or group of radios on one sector could be increased during times when power from the other sectors was available.

The amplified composite signals provided by amplifiers $A_1$–$A_4$ are applied to second input ports 33-4 to 33-1, respectively, of second distributing network 38. Network 38 recombines the amplified composite signals to provide amplified, reconstructed output signals $S_1'$–$S_3'$ at second output ports $OP_1$–$OP_3$, respectively. Each output signal $S_1'$–$S_3'$ is thus an amplified version of corresponding input signals $S_1$–$S_3$. In the ideal case, no signal power appears on output port $OP_4$ in the absence of an input signal applied to port $IP_4$. Practically, however, low level signals will appear at port $OP_4$ due to manufacturing tolerances in the amplifiers and distributing networks. It is noted that, if an input signal were to be applied to first input port $IP_4$, an amplified version of that signal would appear on port $OP_4$.

Figure 4:
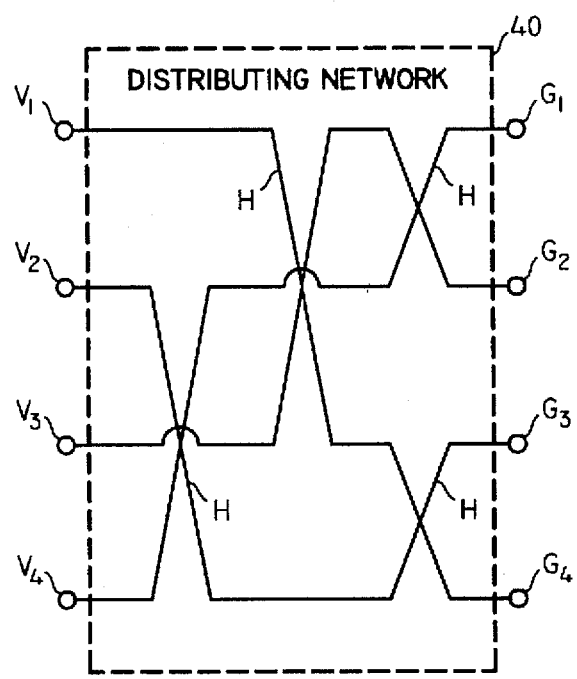
FIG. 4 is a schematic diagram of a distributing network, which may be used within the amplifier networks of FIGS. 2 or 3.

FIG. 4 shows a circuit diagram of an illustrative distributing network 40, which may be used for each of distributing networks 36 and 38 of FIG. 3. Distributing network 40 is a combination of four quadrature hybrid couplers H interconnected as shown. Quadrature hybrid couplers, e.g., 3 dB branch-line couplers, are well known in the art and can be fabricated in a variety of transmission line mediums, such as in microstrip.

Figure 5:
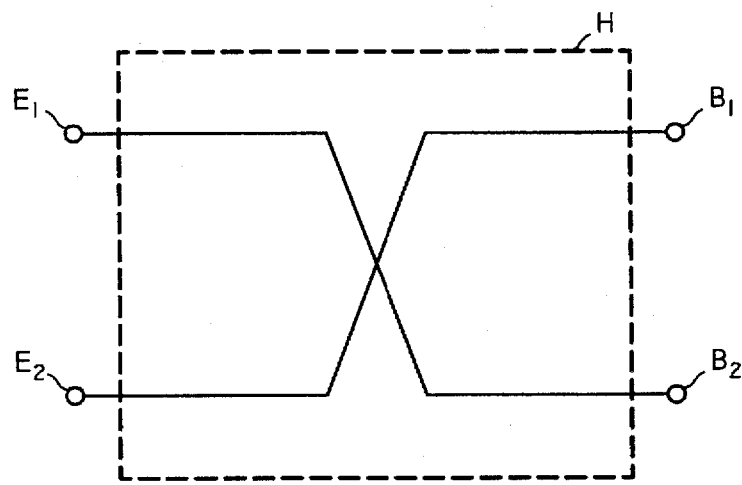
FIG. 5 is a schematic diagram of a quadrature hybrid coupler used within the network of FIG. 4.

FIG. 5 is a schematic representation of quadrature hybrid coupler H. Assuming −3 dB coupling values, RF power applied to input port $E_1$ is split equally between output ports $B_1$ and $B_2$. The signal or signal portion output at port $B_2$ is −90° out of phase relative to the signal portion at $B_1$. Similarly, a signal applied to input port $E_2$ will produce signals at $B_1$ and $B_2$, where the signal at port $B_1$ lags that at port $B_2$ by 90°. Assuming −3 dB couplings and that the couplers are ideal and matched at all ports, reflections can be assumed to be zero at the coupler ports. The transfer function, therefore, may be calculated using transmission coefficients rather than two-port S-parameters.

Referring again to FIG. 4, each input signal or signal portion present at any one of input ports $V_1$–$V_4$, is split into four signal portions and distributed via the coupler paths to each of output ports $G_1$, $G_2$, $G_3$ and $G_4$. Accordingly, each of output ports $G_1$–$G_4$ contains elements of each of the input signals but at different phases. In particular, the voltage level of each output signal present at each output port $G_1$–$G_4$, due to a given input signal at any one of ports $V_1$–$V_4$, is proportional to the voltage level of the input signal. When there are X output ports, the proportion of the voltage level of a signal at any one of the output ports in comparison to the voltage level of a signal applied to an input port is $1/\sqrt{X}$ or $X^{-\frac{1}{2}}$. It is noted that the square root relationship holds because power is conserved.

TABLE 1

|  | $V_1$ | $V_2$ | $V_3$ | $V_4$ |
|---|---|---|---|---|
| $G_1$ | 0° | −90° | −90° | −180° |
| $G_2$ | −90° | 0° | −180° | −90° |
| $G_3$ | −90° | −180° | 0° | −90° |
| $G_4$ | −180° | −90° | −90° | 0° |

Table 1, as illustrated above, depicts the phase shifting characteristics of distributing network 40. For example, a signal present at input $V_1$ of network 40 has a zero degree phase shift present at output port $G_1$, a $-90°$ phase shift at output ports $G_2$ and $G_3$ and a $-180°$ phase shift at output port $G_4$. (These phase shifts are relative to one another). Further, the signal group delays attributed between each respective input port $V_1$-$V_4$, and output ports $G_1$-$G_4$, is equal for all sixteen paths. It is to be appreciated that the above reference to power distribution, voltage levels, phase shifting and delays relative to signals applied to network 40 is well known to one ordinarily skilled in the art.

In one embodiment of power sharing amplifier network 22a of FIG. 3, a distributing network 40 replaces first distributing network 36, and another distributing network 40 replaces second distributing network 38. This pair of distributing networks 40 can be used for first and second distributing networks 36 and 38 by using the following orientations: for network 36, first input ports $IP_1$-$IP_4$ are replaced with respective input ports $V_1$-$V_4$ of network 40; first output ports 31-1 to 31-4 are replaced with output ports $G_1$-$G_4$, respectively. For network 38, second input ports 33-4 to 33-1 are replaced with output ports $G_1$-$G_4$, respectively; second output ports $OP_4$-$OP_1$ are replaced with input ports $V_1$-$V_4$, respectively. Hence, the same part can be used for networks 36 and 38 but with the input and output ports reversed. With these orientations, the amplified composite signals from amplifiers $A_1$ to $A_4$ will be redistributed within second distributing network 38 such that amplified, reconstructed signals $S_1'$-$S_3'$, indicative of respective input signals $S_1$-$S_3$, appear at respective output ports $OP_1$-$OP_3$. Reconstruction is possible due to the amplitude and phase relationships between corresponding signal portions of the amplified composite signals—as such, it is preferable for amplifiers $A_1$-$A_4$ to each have the same insertion phase delay so that the proper phase relationships are maintained at the input ports 33-4 to 33-1 of second distributing network 38. One skilled in the art can readily derive, using Table 1, how signals $S_1'$-$S_3'$ are reconstructed within second distributing network 38, and therefore, derivation will not be presented here.

Figure 6:
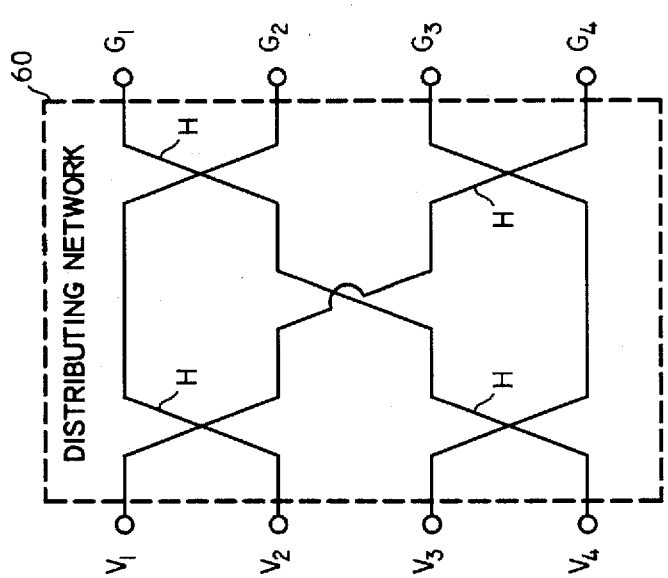
FIG. 6 shows a schematic diagram of an alternate distributing network, which can be used within the amplifier networks of FIGS. 2 or 3.

FIG. 6 is a schematic diagram of an alternate distributing network 60, which may be used for each of distributing networks 36 and 38 of FIG. 3. Distributing network 60 employs four hybrid couplers H interconnected as shown, whose functional characteristics were described above. Table 2 below depicts the relative phase relationships of signals on output ports $G_1$-$G_4$ of network 60 that result from individual signals being applied to input ports $V_1$-$V_4$ of network 60. For instance, a signal applied to input port $V_2$ produces a signal on each output port $G_1$, $G_2$, $G_3$ and $G_4$, where the signal on port $G_1$ has a relative phase of $-90°$, the signal on port $G_2$ has a relative phase of $-180°$, and so forth.

In another embodiment of power sharing amplifier network 22a of FIG. 3, a pair of distributing networks 60 are used for first and second distributing networks 36 and 38 by using the same port orientations as was described above for the use of distributing networks 40 therein. With such orientations, amplified, reconstructed signals $S_1'$-$S_3'$, indicative of respective input signals $S_1$-$S_3$, appear at respective output ports $OP_1$-$OP_3$. One skilled in the art can readily ascertain, using Table 2, the manner in which signals $S_1'$-$S_3'$, are reconstructed, and therefore, derivation need not be presented here.

TABLE 2

|   | $V_1$ | $V_2$ | $V_3$ | $V_4$ |
|---|---|---|---|---|
| $G_1$ | 0° | −90° | −90° | −180° |
| $G_2$ | −90° | −180° | 0° | −90° |
| $G_3$ | −90° | 0° | −180° | −90° |
| $G_4$ | −180° | −90° | −90° | 0° |

Distributing networks 40 or 60 can be readily modified for use in conjunction with more or fewer amplifiers $A_1$-$A_N$ and input signals $S_1$-$S_N$. Specifically, either distributing network 40 or 60 can be modified so that $K=2^M$ output ports, $G_1$ to $G_K$, and $2^M$ input ports $V_1$ to $V_K$ are provided, for use in conjunction with $2^M$ amplifiers $A_1$ to $A_K$, where M is an integer. It is noted that, whatever configuration is used for distributing networks 36 and 38, the number of input signals may be less than the number of input ports and output ports. In this case, power sharing of each input signal among the amplifiers will still be achieved, but there will be unused input ports of network 36 and unused output ports of network 38.

It is further noted that other arrangements may be used for distributing networks 36 and 38 to effect power sharing among amplifiers $A_1$-$A_N$. For example, a first Butler Matrix may be used for first distributing network 36, having input ports for receiving input signals $S_1$-$S_N$. A second Butler Matrix identical to the first Butler Matrix may be used for second distributing network 38. With this configuration, reconstruction of output signals $S_1'$-$S_N'$ will occur if the output ports of the second Butler Matrix are used to receive the amplified composite signals from amplifiers $A_1$-$A_N$, so that signals $S_1'$-$S_N'$ appear on the input ports of the second Butler Matrix.

Figure 7:
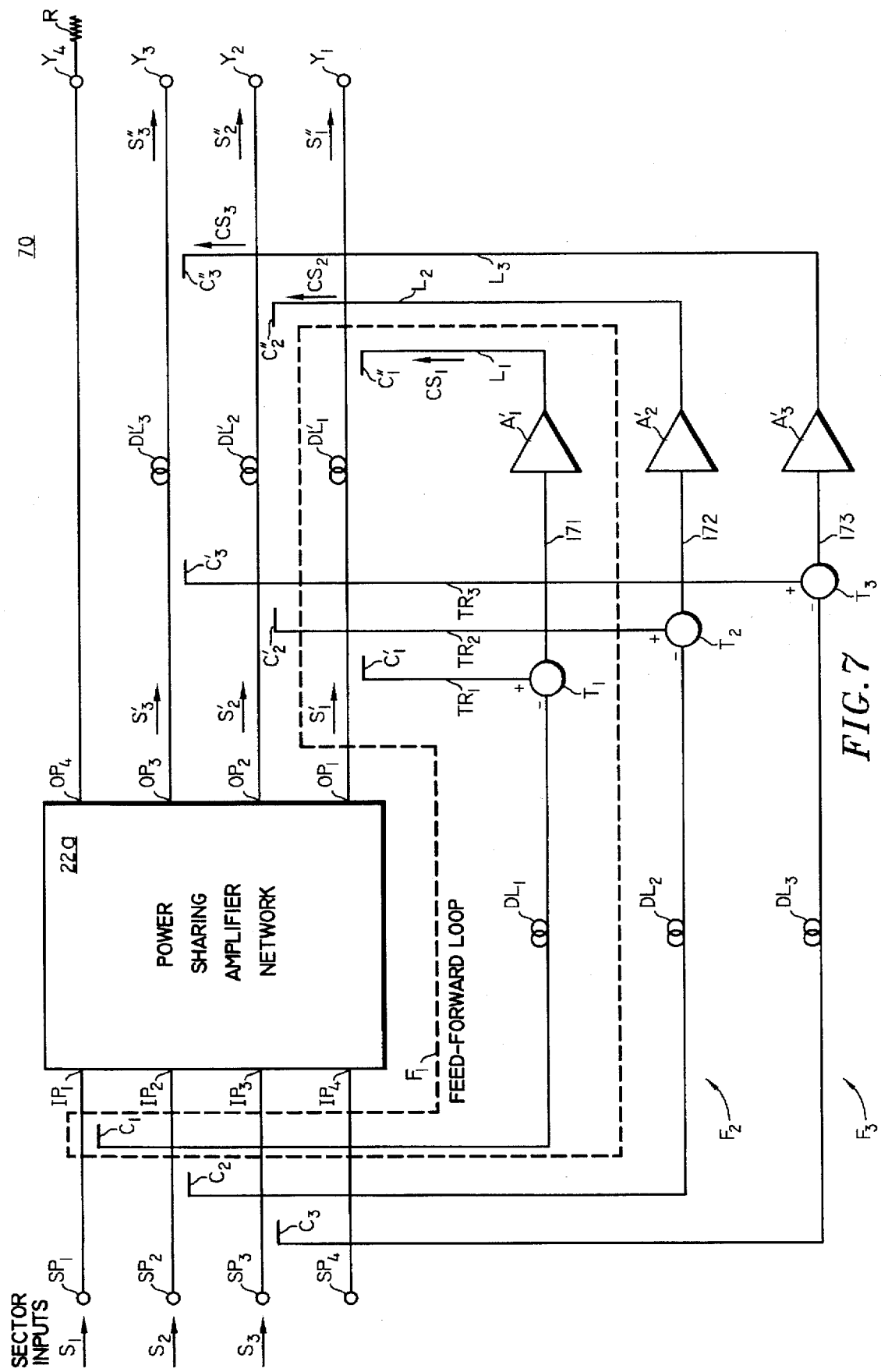
FIG. 7 is schematic block diagram of an embodiment of a low distortion power sharing amplifier network in accordance with the present invention.

FIG. 7 depicts a block diagram of a low distortion amplifier network in accordance with the present invention, referred to generally as 70. Amplifier network 70 is a special case of amplifier network 20 of FIG. 2, in that amplifier network 70 is configured to amplify only up to four input signals. For illustrative purposes, amplifier network 70 will be described as functioning to amplify three input signals $S_1$-14 $S_3$ to produce three corresponding output signals $S_1''$-$S_3''$. In this case, each output signal can then be applied to a directional antenna (not shown) that transmits in an associated 120 degree azimuthal sector, thereby attaining complete azimuthal coverage in a wireless communication system.

Amplifier network 70 includes power sharing amplifier network 22a, previously described. Three feed-forward loops $F_1$-$F_3$ are employed to reduce distortion within respective output signals $S_1'$-$S_3'$ so as to provide low distortion output signals $S_1''$-$S_3''$, respectively. It is understood that the number of feed-forward paths employed will generally correspond to the number of RF output signals that are selected to have distortion further reduced. Hence, in modified configurations, more or less than four input ports and four output ports, with or without RF signals thereon, may be employed, and a corresponding number of feed-forward loops may be utilized.

Feed-forward loop $F_1$ includes: first, second and third sampling couplers $C_1$, $C_1'$ and $C_1''$, respectively; delay lines $DL_1$ and $DL_1'$; tap coupler $T_1$; transmission lines $TR_1$ and $L_1$; and correction amplifier $A_1'$. Feed-forward loops $F_2$ and $F_3$ have similarly labeled components—for example, feed-forward loop $F_3$ includes first, second and third sampling couplers $C_3$, $C_3'$ and $C_3''$; correction amplifier $A_3'$; and so forth.

First sampling couplers $C_1$–$C_3$ couple signal power of respective input signals $S_1$–$S_3$ towards respective tap couplers $T_1$–$T_3$ via associated delay lines $DL_1$–$DL_3$. Since these RF input signals have not yet been amplified, they contain only fundamental frequency power without distortion components. Tap couplers $T_1$–$T_3$ are also respectively coupled to second sampling couplers $C_1'$–$C_3'$, via respective transmission lines $TR_1$–$TR_3$. Second sampling couplers $C_1'$–$C_3'$ couple signal power from the amplified, reconstructed RF output signals $S_1'$–$S_3'$ present at output ports $OP_1$–$OP_3$ of amplifier network 22a. These RF output signals contain fundamental frequency power as well as distortion power that is primarily due to IMD product generation within amplifier network 22a. The RF signal power coupled by second sampling couplers $C_1'$–$C_3'$ is combined to add negatively within tap couplers $T_1$–$T_3$ with the signals coupled by first sampling couplers $C_1$–$C_3$, respectively. Tap couplers $T_1$–$T_3$ thus function as subtracters to subtract, via vectorial combination, the fundamental and distortion power provided by the second sampling couplers from the fundamental frequency power provided by the first sampling couplers (or vice versa). Fundamental frequency power applied to each of the tap couplers is thus cancelled and dissipated within their internal resistors (not shown). As a result, feed-forward signals comprised substantially of distortion power are provided on output ports 171–173 of respective tap couplers $T_1$–$T_3$.

Suitable couplers which can be used for the tap couplers to achieve the above objectives are well known in the art and include hybrids such as branch-line couplers or "rat races," as well as "in-phase" couplers such as Wilkinson couplers. All of these can be readily manufactured in microstrip or stripline mediums, and are commercially available from various manufacturers.

The selection of the coupling values for the first and second sampling couplers and for the tap couplers must be such that appropriate power levels add negatively within the tap couplers to effect signal cancellation therein. Moreover, the two signals to be cancelled within each tap coupler must be applied thereat in a proper phase relationship, which depends upon the type of tap coupler used, so that cancellation at the fundamental frequencies results. To achieve signal cancellation over a range of fundamental frequencies, it is preferable to match the phase delay of each delay line $DL_1$–$DL_3$ with the phase delay in the combined electrical path of: 1) the corresponding transmission $TR_1$–$TR_3$, and 2) the electrical length through amplifier network 22a.

The feed-forward signals on ports 171–173 are amplified in final correction amplifiers $A_1'$, $A_2'$ and $A_3'$, respectively, to produce correction signals $CS_1$–$CS_3$, respectively. Correction signals $CS_1$–$CS_3$ are provided to third sampling couplers $C_1''$, $C_2''$ and $C_3''$ via respective transmission lines $L_1'$, $L_2'$ and $L_3'$. The correction signals add destructively within the third sampling couplers with output signals $S_1'$–$S_3'$, removing unwanted distortion products present therein. The third sampling couplers thus function as subtracters, subtracting (via vectorial combination) the correction signals from the associated RF output signals $S_1'$–$S_3'$.

Cancellation of the distortion power, which is primarily IMD products, is achieved by supplying each correction signal to the respective third sampling coupler $C_1''$–$C_3''$ at a predefined amplitude and phase relationship with respect to the reconstructed RF output signals $S_1'$–$S_3'$ applied thereat. The amplitude relationship must be chosen to be consistent with the coupling value used for third sampling couplers $C_1''$–$C_3''$. The phase relationship is selected in accordance with the type of third sampling coupler used—e.g., 180° out of phase for Wilkinson couplers to achieve cancellation. To provide the proper phase relationship over a desired frequency range, phase matching should be provided between the two electrical paths that stem from the second sampling couplers—i.e., the direct path and the feed-forward path. Thus, for example, the electrical lengths of each delay line $DL_1'$–$DL_3'$ should be substantially equal to the combined electrical lengths of: associated transmission line $TR_1$–$TR_3$; tap coupler $T_1$–$T_3$; amplifier $A_1'$–$A_3'$; and transmission line $L_1$–$L_3$.

It is noted that the gain of each correction amplifier $A_1'$–$A_3'$ needs to be selected in conjunction with the coupling values for the sampling and tap couplers and the gain of the amplifier network. For example, if one were to use coupling values of 10 dB for coupler $C_1$ and for coupler $C_1''$; and 20 dB for tap coupler $T_1$ and for second sampling coupler $C_1'$; and a gain of 30 dB for amplifier network 22a, then the correction amplifier $A_1''$ gain would need to be on the order of 50 dB to achieve substantial cancellation of distortion components.

The final output signals $S_1''$–$S_3''$ on respective output lines $Y_1$–$Y_3$ are nearly linear signals as a result of the low distortion amplification within power sharing network 22a and the subsequent elimination of distortion products by means of feed-forward loops $F_1$–$F_3$. (Output port $Y_4$ is terminated with termination R in this example). Each output signal can then be further processed or applied to an antenna for transmission to wireless terminals. For example, where the amplifier network 70 is employed as the final amplifier stage of a base station transmitter, each output line $Y_1$–$Y_3$ may connect to a directional antenna dedicated to transmit over a given 120° azimuthal sector, to achieve complete 360° coverage.

One advantage of a typical embodiment of the present invention is that the shared average power between sectors results in an improvement in blocking efficiency within the wireless communications system. Blocking efficiency is a measure of how many simultaneous calls can reach their destination, and is generally determined statistically. Communication systems are designed for a given blocking rate, for example, 1%, which means that on average, 1% of calls will encounter a busy circuit and will be blocked. A system with a blocking rate equal to zero can handle all users simultaneously. By improving blocking efficiency, the total watts of amplification can be reduced in each base station site, for a given blocking rate.

Figure 1:
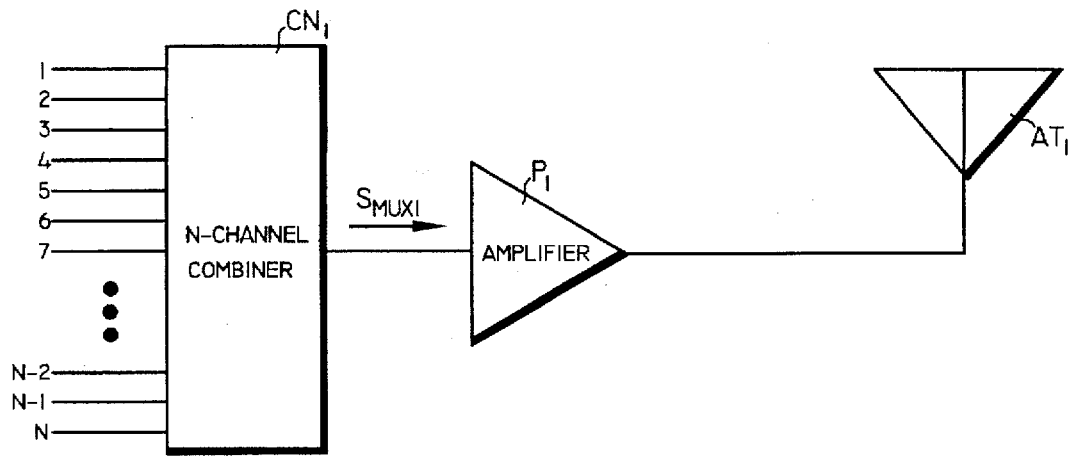
FIG. 1 is a schematic diagram of a base station transmitter configuration of a prior art wireless communications system.
Figure 1:
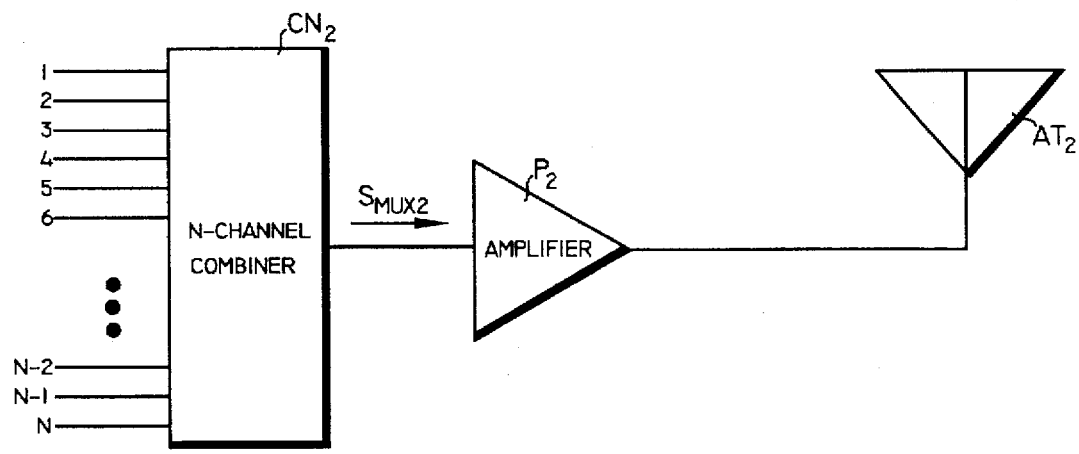
Figure 1:
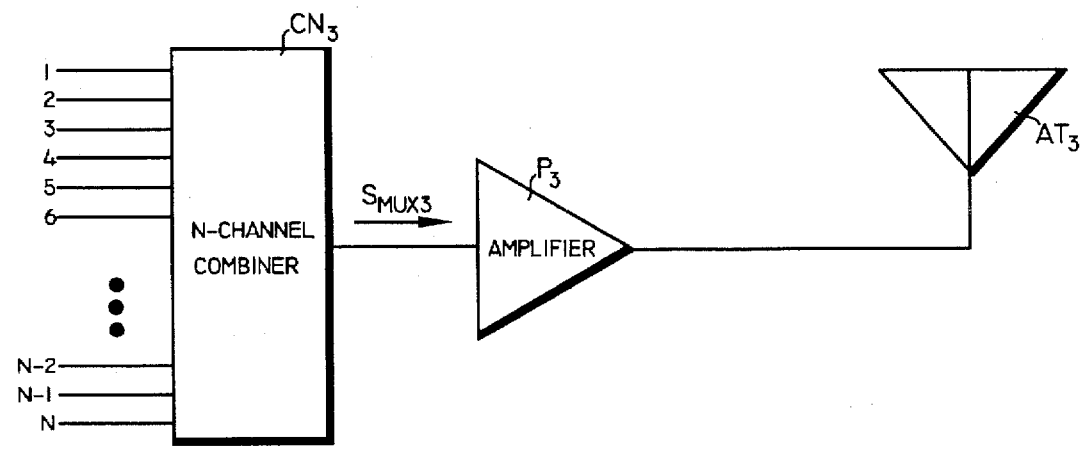

For example, a three-sector prior art system such as that shown in FIG. 1 may use 12 radios in each sector, with each radio being used for a single communication channel at a time. As such, if all 12 radios of a given sector are used simultaneously, the multiplexed signal such as $S_{MUX1}$ associated with that sector will consist of an FDM signal of 12 channels. If the amplified RF output of the associated power amplifier such as $P_1$ is, for example, 240 watts, then each channel will have an RF output of 240/12=20 watts. With each sector serving, for example, 220 subscribers, then at any given time, 12/220 or about 5.5% of the subscribers can simultaneously use their wireless terminal. Based on the well known Erlang tables, if these 220 subscribers have an average 3% usage factor, the blocking rate will be 2%. Now, if the low distortion amplifier network 70 of FIG. 7 is used to replace this system to serve the same number of subscribers—that is, 3×220=660 subscribers for the three sector system—then the same 2% blocking rate could be achieved by using only 28 radios. This reduction in radios is based on the Erlang tables and assumes the same average usage factor of 3% for the 660 subscribers. With only 28 radios, the total RF power that needs to be produced is 28×20 watts=560 watts, a 22% reduction as compared to the 720 watts (i.e., 3×240 watts) required in the prior art system.

An advantage of using feed-forward loops $F_1$-$F_N$ in conjunction with amplifier network 22 (FIG. 2) is that more efficient (albeit less nearly linear) amplifiers such as class AB amplifiers, can be used within amplifier network 22 to achieve the same output distortion level. For instance, it is assumed that a distortion level of "P" dB can be attained with the use of amplifier network 22 without the feed-forward loops by using relatively inefficient but highly linear amplifiers such as class A amplifiers. This same output distortion level P dB can be attained while achieving higher efficiency, by adding feed-forward loops $F_1$-$F_N$ and replacing those class A amplifiers with more efficient but less linear amplifiers such as class AB amplifiers.

Figure 8:
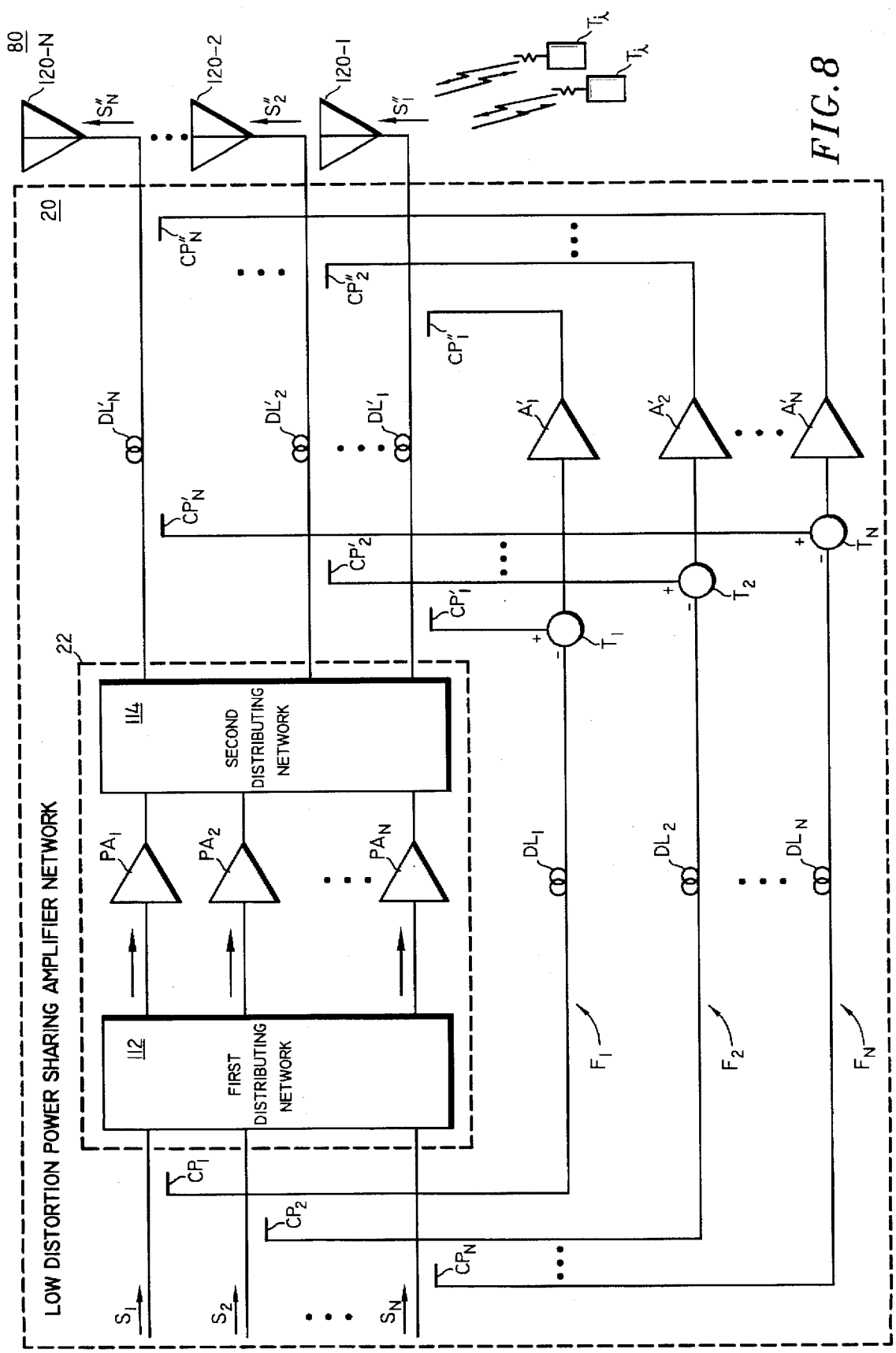
FIG. 8 is a block diagram of an embodiment of a wireless communications system in accordance with the present invention.

FIG. 8 illustrates an embodiment of a wireless communications system in accordance with the present invention, designated generally as 80. System 80 includes low distortion, power sharing network 20, which excites a plurality N of directional transmitting antennas 120-1 to 120-N at the base station of system 80. Each antenna 120-1 to 120-N tranceives signals between a plurality of wireless terminals $T_i$ located within a predefined angular sector associated with that antenna.

Multi-carrier, RF modulated input signals $S_1$-$S_N$ carry communication information intended for wireless terminals $T_i$ within the associated angular sectors. Amplifier network 20 amplifies these signals in a power sharing arrangement to produce corresponding amplified output signals $S_1''$-$S_N''$, which are radiated via respective antennas 120-1 to 120-N. In this embodiment, network 22 includes N amplifiers $PA_1$-$PA_N$ coupled between first and second distributing networks 112 and 114. Networks 112 and 114 may be comprised of hybrid couplers, similar to distributing networks 60 or 40 described above, but modified to have N input ports and N output ports. Feed-forward loops $F_1$-$F_N$ are employed to reduce distortion within each of respective output signals $S_1''$-$S_N''$.

What has been described herein is merely illustrative of the application of the principles of the present invention. Other arrangements and methods can be implemented by one skilled in the art without departing from the spirit and scope of this invention as defined by the appended claims.

What is claimed is:

1. An apparatus for amplifying a plurality of input signals, comprising:

a first distributing network for receiving said input signals at respective ones of a plurality of first input ports thereof, said first distribution network splitting each said input signal among a plurality of first output ports thereof, to thereby provide a set of first signals;

a plurality of amplifiers for amplifying said set of first signals in a power-sharing arrangement to provide a set of amplified signals;

a second distributing network for receiving said set of amplified signals at respective ones of a plurality of second input ports thereof and generating therefrom a plurality of amplified, reconstructed output signals at respective ones of a plurality of second output ports thereof, each output signal indicative of one of said input signals; and a feed-forward loop for generating a correction signal derived from an associated one of said input signals and an associated one of said output signals, and for vectorially combining said correction signal with said one associated output signal to reduce distortion within said output signal.

2. The apparatus according to claim 1, wherein said feed-forward loop comprises:

a first subtracter for vectorially combining a coupled portion of said associated input signal with a coupled portion of said associated output signal to provide a feed-forward signal;

a correction amplifier for amplifying said feed-forward signal to provide said correction signal; and a second subtracter for vectorially combining said correction signal with said associated output signal to reduce distortion within said output signal.

3. The apparatus according to claim 1, wherein each of said amplifiers has substantially the same gain and insertion phase delay.

4. The apparatus according to claim 1, wherein said first and second distributing networks are of substantially the same circuit configuration.

5. The apparatus according to claim 1, wherein at least one of said plurality of said input signals comprises a modulated, multi-carrier radio frequency (RF) signal.

6. The apparatus according to claim 1, further comprising a plurality of said feed-forward loops, each operable to reduce distortion within an associated one of said plurality of output signals, with each of said plurality of feed-forward loops including an associated said first subtracter, said correction amplifier and said second subtracter.

7. The apparatus according to claim 1, wherein:

said first distributing network having four first input ports;

said plurality of second output ports of said second distributing network comprises four output ports;

said plurality of input signals comprises three input signals; and said plurality of reconstructed output signals comprises three output signals, each at one of the three corresponding second output ports.

8. The apparatus according to claim 1, wherein each of said first and second distributing networks comprise a plurality of quadrature hybrid couplers.

9. The apparatus according to claim 1, wherein said first and second distributing networks each comprise a Butler Matrix.

10. The apparatus according to claim 1, wherein said correction signal is comprised substantially of distortion power at corresponding frequencies of intermodulation distortion (IMD) products of said reconstructed output signal.

11. The apparatus according to claim 2, wherein said feed-forward loop further includes:

a first sampling coupler for receiving said input signal and providing said coupled portion of said input signal;

a first delay line coupled between said first sampling coupler and said first subtracter;

a second sampling coupler coupled to said second distributing network for providing said coupled portion of said output signal; and a first transmission line coupled between said second sampling coupler and said first subtracter.

12. The apparatus according to claim 11, wherein the electrical length of said first delay line is substantially equal to the combined electrical length of an electrical path through said first distributing network, said plurality of amplifiers, said second distributing network, and said first transmission line, wherein said first subtracter is operable to provide said feed forward signal containing distortion power substantially without fundamental frequency power over a range of frequencies of said input signal.

13. The apparatus according to claim 12, further including:
   a second transmission line coupled between said correction amplifier and said second subtracter; and
   a second delay line coupled between said second sampling coupler and said second subtracter, having an electrical length substantially equal to the electrical length of an electrical path defined by said first transmission line through said first subtracter, said correction amplifier and said second transmission line, whereby distortion power within said output signal is reduced within said second subtracter over a range of frequencies.

14. A wireless communication system, comprising:
   A) a plurality of directional transmitting antennas;
   B) a transmitter section including a low distortion, power sharing amplifier network coupled to said plurality of antennas, wherein said amplifier network comprises:
      i) a first distributing network for receiving a plurality of radio frequency (RF) input signals at a plurality of respective first input ports thereof and generating therefrom a set of RF composite signals, with each composite signal having signal power of each of said RF input signals;
      ii) a plurality of RF amplifiers coupled to said first distributing network for amplifying said set of first RF composite signals in a power-sharing arrangement to provide a set of amplified signals;
      iii) a second distributing network coupled to said plurality of RF amplifiers for receiving said set of amplified signals and generating therefrom a plurality of amplified, reconstructed output signals at a plurality of respective second output ports thereof, each indicative of an associated one of said plurality of RF input signals; and
      iv) a feed-forward loop for generating a correction signal derived from an associated one of said RF input signals and an associated one of said reconstructed RF output signals, and for vectorially combining said correction signal with said associated RF output signal to reduce distortion within said RF output signal.

15. The wireless communication system according to claim 14, wherein said feed-forward loop comprises:
   a first subtracter for vectorially combining a coupled portion of an associated one of said RF input signals with a coupled portion of said associated RF output signal to provide a feed-forward signal;
   a correction amplifier for amplifying said feed-forward signal to provide a correction signal; and
   a second subtracter for vectorially combining said correction signal with said associated RF output signal to reduce distortion within said associated RF output signal.

16. The wireless communication system according to claim 15, further comprising a plurality of said feed-forward loops, each operable to reduce distortion within an associated one of said plurality of output signals, with each of said plurality of feed-forward loops including an associated said first subtracter, said correction amplifier and said second subtracter.

17. A method for low distortion amplification of a plurality of different input signals, each flowing on a different electrical path, comprising:
   splitting each one of said input signals on each said path into a signal portion on each of a plurality of first circuit ports, with a predetermined amplitude and phase relationship between signal portions of a given input signal, wherein a composite signal is formed on each said first circuit port having signal power of each of said input signals;
   separately amplifying each said composite signal to produce amplified composite signals;
   recombining said amplified composite signals to form a plurality of amplified, reconstructed output signals, each indicative of an associated one of said input signals;
   vectorially combining a coupled portion of one of said input signals with a coupled portion of one of said output signals to form a feed-forward signal;
   amplifying said feed-forward signal to form a correction signal having distortion power; and
   vectorially combining said correction signal with said output signal to reduce distortion within said output signal.

18. The method according to claim 17, further comprising radiating each output signal towards wireless terminals disposed within angular sectors associated with each said output signal.

19. An apparatus for amplifying a plurality of input signals, comprising:
   first distributing network means for receiving said input signals at respective ones of a plurality of first input ports thereof and splitting each one of said input signals among a plurality of first output ports, to thereby provide a set of first signals;
   amplifier means for amplifying said set of first signals in a power-sharing arrangement to provide a set of amplified signals;
   second distributing network means for receiving said set of amplified signals at respective ones of a plurality of second input ports thereof and generating therefrom a plurality of amplified, reconstructed output signals, each indicative of one of said input signals; and
   feed-forward loop means for generating a correction signal derived from an associated one of said input signals and an associated one of said output signals, and for vectorially combining said correction signal with said associated output signal to reduce distortion within said output signal.

* * * * *